United States Patent
Chu et al.

(10) Patent No.: US 12,272,602 B2
(45) Date of Patent: Apr. 8, 2025

(54) SELECTIVE DUAL SILICIDE FORMATION

(71) Applicant: Taiwan Semiconductor Manufacturing Co., Ltd., Hsinchu (TW)

(72) Inventors: Peng-Wei Chu, Hsinchu (TW); Sung-Li Wang, Hsinchu (TW); Yasutoshi Okuno, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/666,322

(22) Filed: May 16, 2024

(65) Prior Publication Data

US 2024/0304499 A1 Sep. 12, 2024

Related U.S. Application Data

(60) Continuation of application No. 17/816,039, filed on Jul. 29, 2022, now Pat. No. 11,990,376, which is a continuation of application No. 17/226,822, filed on Apr. 9, 2021, now Pat. No. 11,482,458, which is a division of application No. 16/354,259, filed on Mar. 15, 2019, now Pat. No. 10,978,354.

(51) Int. Cl.
*H01L 21/8238* (2006.01)
*H01L 21/285* (2006.01)
*H01L 27/092* (2006.01)

(52) U.S. Cl.
CPC ........... *H01L 21/823814* (2013.01); *H01L 21/28518* (2013.01); *H01L 27/0924* (2013.01)

(58) Field of Classification Search
CPC ....... H01L 21/823814; H01L 21/28518; H01L 27/0924
See application file for complete search history.

(56) References Cited

U.S. PATENT DOCUMENTS 5,856,237 A 1/1999 Ku
6,204,170 B1 3/2001 Taguwa
(Continued)

FOREIGN PATENT DOCUMENTS

KR 20000000869 A 1/2000
KR 100538806 B1 12/2005
(Continued)

OTHER PUBLICATIONS

Expired U.S. Appl. No. 62/591,133 entitled "Semiconductor Device and Manufacturing Method Thereof" filed Nov. 27, 2017, 26 pages.

*Primary Examiner* — Christine A Enad
(74) *Attorney, Agent, or Firm* — HAYNES AND BOONE, LLP

(57) ABSTRACT

A semiconductor device and a method of making the same are provided. A method according to the present disclosure includes forming a first type epitaxial layer over a second type source/drain feature of a second type transistor, forming a second type epitaxial layer over a first type source/drain feature of a first type transistor, selectively depositing a first metal over the first type epitaxial layer to form a first metal layer while the first metal is substantially not deposited over the second type epitaxial layer over the first type source/drain feature, and depositing a second metal over the first metal layer and the second type epitaxial layer to form a second metal layer.

20 Claims, 11 Drawing Sheets

(56) References Cited

U.S. PATENT DOCUMENTS

Figure 1:
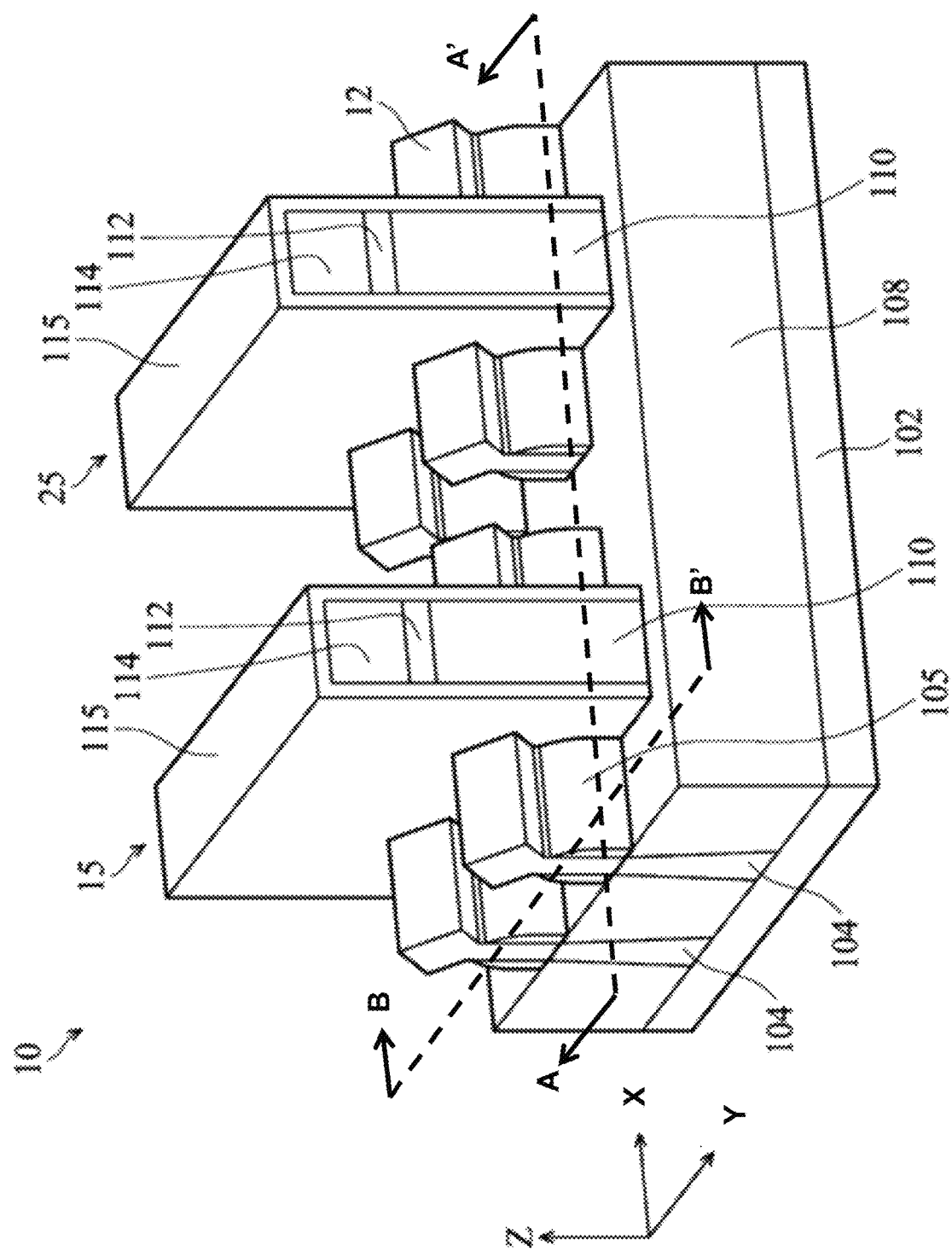

| | | |
|---|---|---|
| 6,461,960 B2 | 10/2002 | Lee |
| 7,868,458 B2 | 1/2011 | Lee |
| 8,772,109 B2 | 7/2014 | Colinge |
| 8,785,285 B2 | 7/2014 | Tsai |
| 8,796,666 B1 | 8/2014 | Huang |
| 8,815,712 B2 | 8/2014 | Wan |
| 8,816,444 B2 | 8/2014 | Wann |
| 8,823,065 B2 | 9/2014 | Wang |
| 8,860,148 B2 | 10/2014 | Hu |
| 8,963,258 B2 | 2/2015 | Yu |
| 9,093,530 B2 | 7/2015 | Huang |
| 9,105,490 B2 | 8/2015 | Wang |
| 9,171,929 B2 | 10/2015 | Lee |
| 9,214,555 B2 | 12/2015 | Oxland |
| 9,236,267 B2 | 1/2016 | De |
| 9,236,300 B2 | 1/2016 | Liaw |
| 9,362,285 B2 | 6/2016 | Basker |
| 9,449,885 B1 | 9/2016 | Reznicek |
| 9,520,482 B1 | 12/2016 | Chang |
| 9,548,303 B2 | 1/2017 | Lee |
| 9,576,814 B2 | 2/2017 | Wu |
| 9,812,453 B1 | 11/2017 | Mulfinger |
| 9,837,510 B2 | 12/2017 | Chang |
| 9,876,112 B2 | 1/2018 | Huang |
| 10,079,210 B2 | 9/2018 | Lee |
| 10,566,246 B1 * | 2/2020 | Wu ............ H01L 21/76846 |
| 10,573,752 B2 | 2/2020 | Li |
| 11,031,300 B2 | 6/2021 | Wang |
| 11,482,458 B2 | 10/2022 | Chu |
| 2009/0017619 A1 | 1/2009 | Lee |
| 2015/0132939 A1 | 5/2015 | Hasegawa |
| 2015/0214059 A1 | 7/2015 | Bouche |
| 2016/0087053 A1 | 3/2016 | Kim |
| 2016/0099246 A1 * | 4/2016 | Basker ............ H01L 29/0847 257/369 |
| 2016/0365446 A1 | 12/2016 | Chang |
| 2018/0151683 A1 * | 5/2018 | Yeo ............ H01L 29/0847 |
| 2018/0277446 A1 * | 9/2018 | Gluschenkov ............ H01L 21/823814 |
| 2019/0006509 A1 | 1/2019 | Li |
| 2019/0067013 A1 | 2/2019 | Wang |
| 2019/0164966 A1 | 5/2019 | Wang |
| 2019/0393100 A1 | 12/2019 | Lee |

FOREIGN PATENT DOCUMENTS

| | | |
|---|---|---|
| KR | 20160062717 A | 6/2016 |
| KR | 20160100181 A | 8/2016 |
| KR | 20170042938 A | 4/2017 |
| TW | 201712140 A | 4/2017 |
| TW | 201724273 A | 7/2017 |

* cited by examiner

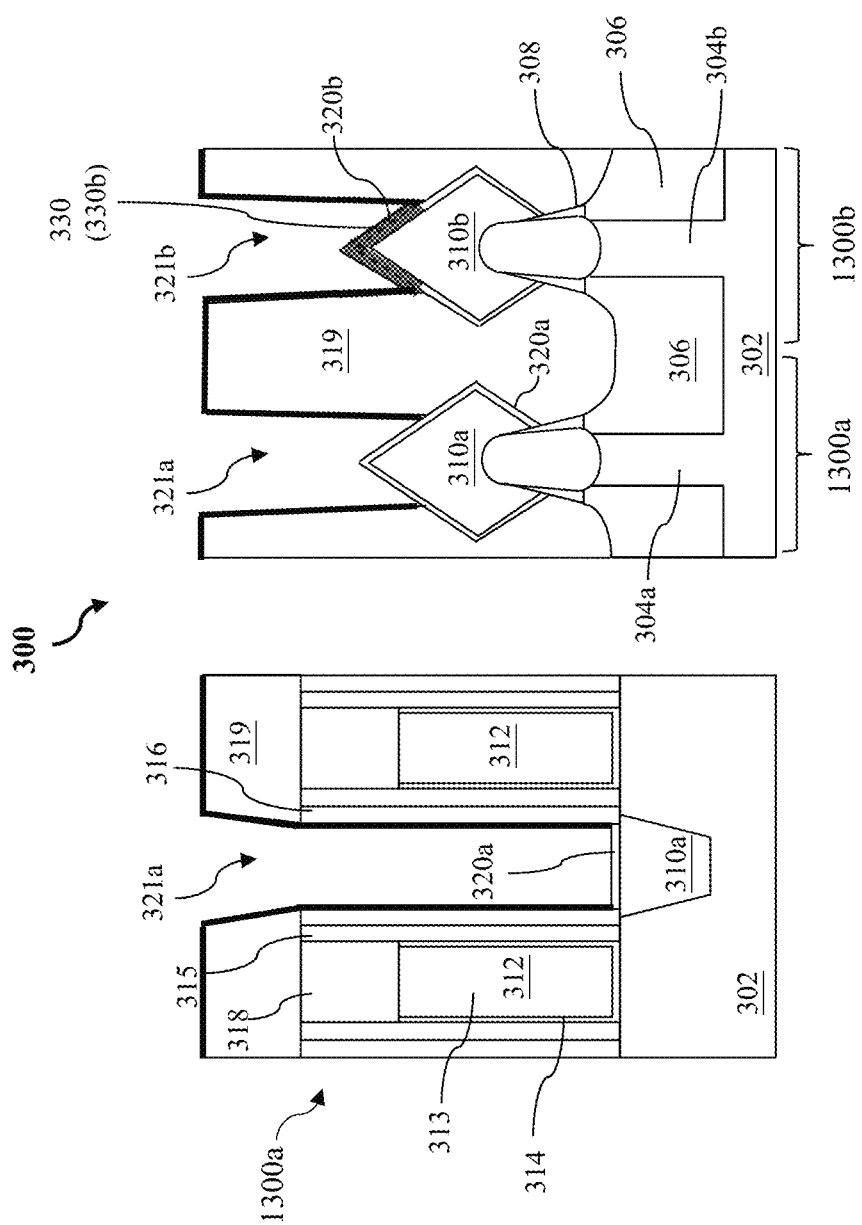

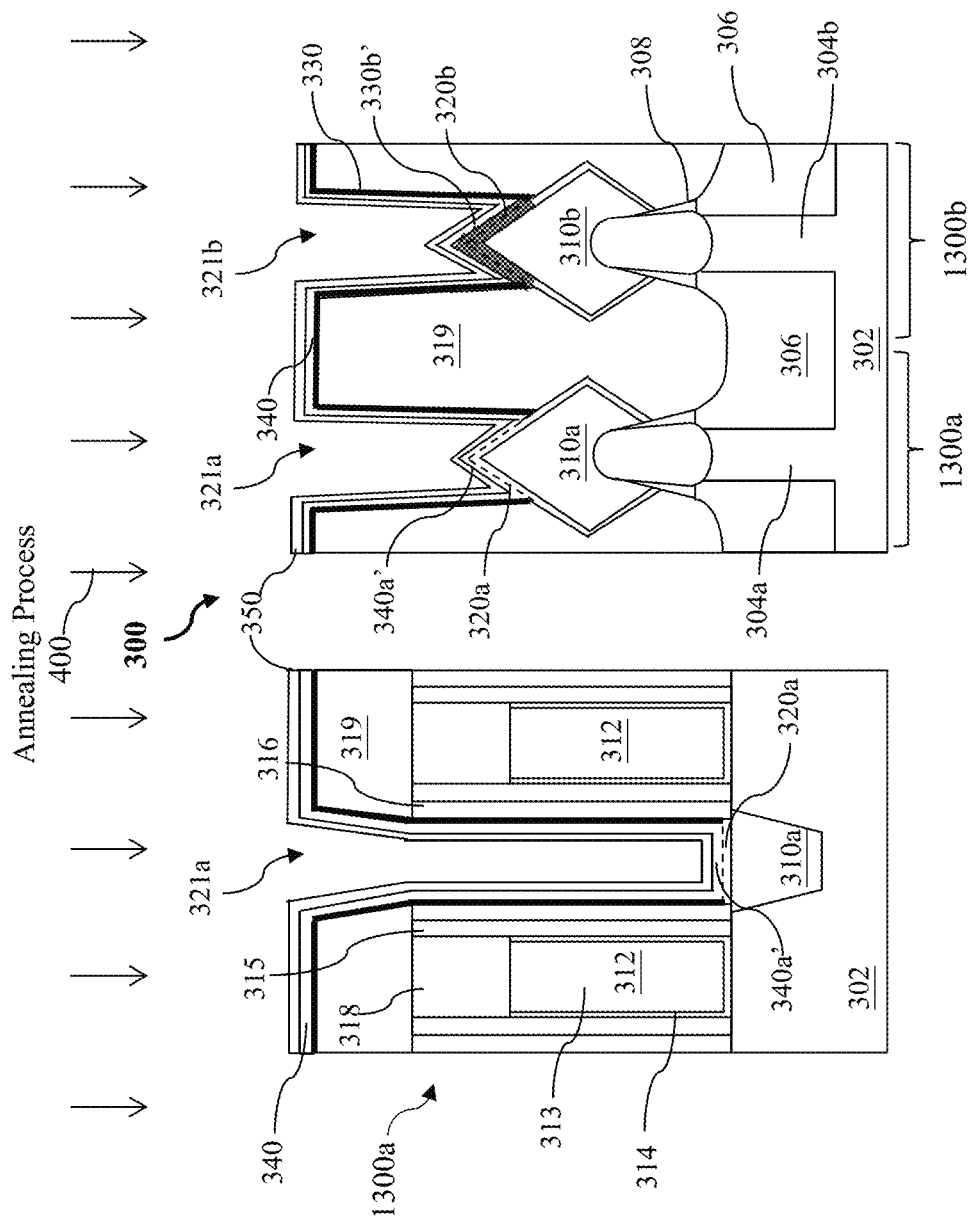

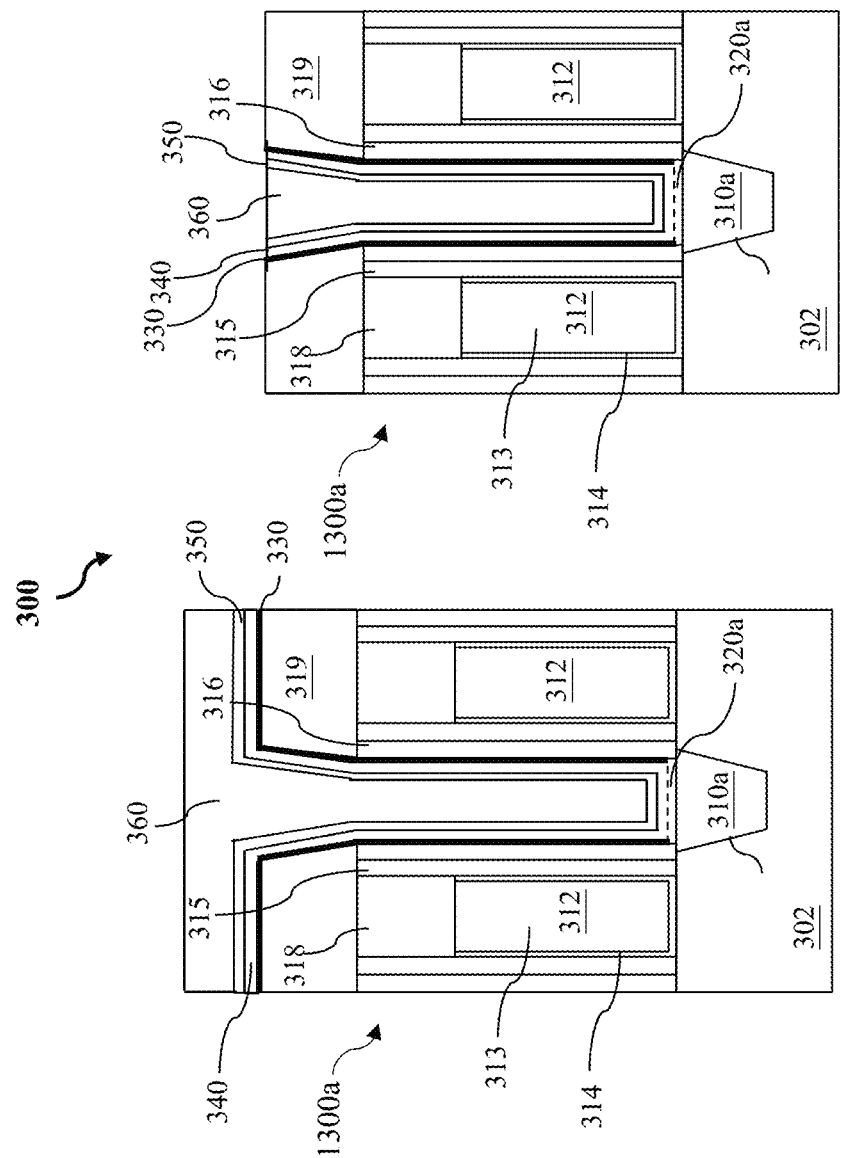

SELECTIVE DUAL SILICIDE FORMATION

PRIORITY

This application is a continuation application of U.S. patent application Ser. No. 17/816,039, filed Jul. 29, 2022, which is a continuation of U.S. patent application Ser. No. 17/226,822, filed Apr. 9, 2021, which is a divisional application of U.S. patent application Ser. No. 16/354,259, filed Mar. 15, 2019, each of which is hereby incorporated by reference in its entirety.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, conventional FinFET devices may still have certain drawbacks. For example, FinFET devices use silicide to provide reduced electrical resistivity for contacts. Some conventional FinFET devices use the same silicide materials for both NFETs and PFETs, which does not optimize device performance. Other conventional FinFET devices employ extra masks and the associated additional fabrication steps to form different silicide materials for NFETs and PFETs. Using the extra masks and having to undergo the additional fabrication steps introduce additional complexity and cost into FinFET fabrication, which is also undesirable.

Therefore, although existing FinFET devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 1 is a perspective view of an example FinFET device.

FIG. 2 is a flowchart illustrating a method of fabricating a semiconductor device according to embodiments of the present disclosure.

FIGS. 3A, 3B, 4A, 4B, 5A, 5B, 6A, 6B, 7A, 7B, 8A, 8B, 9A, 9B, 10, and 11 illustrate fragmentary cross-sectional side views of a portion of a semiconductor device at various stages of fabrication according to different embodiments of the present disclosure.

FIG. 12 illustrates example organometallic compounds that can be used as a precursor for selective deposition of high work function metal layers, according to different embodiments of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a process flow to form NFET silicide and PFET silicide separately without use of additional masks. One type of semiconductor device in which the processes of the present disclosure may be implemented may include FinFET devices. In that regard, a FinFET device is a fin-like field-effect transistor device, which has been gaining popularity in the semiconductor industry. The FinFET device may be a complementary metal-oxide-semiconductor (CMOS) device including a P-type metal-oxide-semiconductor (PMOS) FinFET device and an N-type metal-oxide-semiconductor (NMOS) FinFET device. The following disclosure may use one or more FinFET examples to illustrate various embodiments of the present disclosure, but it is understood that the application is not limited to the FinFET device, except as specifically claimed.

Referring to FIG. 1, a perspective view of an example FinFET device 10 is illustrated. The FinFET device 10 includes an N-type FinFET device structure (NMOS) 15 and a P-type FinFET device structure (PMOS) 25. The FinFET device 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device 10 also includes one or more fin structures 104 (e.g., Si fins) that extend from the substrate 102 in the Z-direction and surrounded by spacers 105 in the Y-direction. The fin structures 104 are elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a double-patterning lithography (DPL) process. DPL is a method of constructing a pattern on a substrate by dividing the pattern into two interleaved patterns. DPL allows enhanced feature (e.g., fin) density. The fin structure 104 also includes an epi-grown material 12, which may (along with portions of the fin structure 104) serve as the source/drain of the FinFET device 10.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device 10 further includes a gate stack structure including a gate electrode 110 and a gate dielectric layer (not shown) below the gate electrode 110. The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). Hard mask layers 112 and 114 may be used to define the gate electrode 110. A dielectric layer 115 may also be formed on the sidewalls of the gate electrode 110 and over the hard mask layers 112 and 114.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 104. In some other embodiments, multiple gate stack structures are formed over the fin structure 104. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, conventional FinFET fabrication may still have shortcomings. For example, metal silicides may be formed for FinFET devices to reduce electrical resistivity for contacts such as source/drain (S/D) contacts, which involves contact between metal silicides and epitaxial features. The resistance of contact to epitaxial source/drain features may be mathematically represented as:

$$Rcsd = \frac{\rho_{csd}}{A} = \frac{\rho_0 \cdot \exp\left(\frac{4\pi\sqrt{\varepsilon m *}}{h} \frac{\Phi_{SBH}}{\sqrt{N}}\right)}{A}$$

where:
$R_{csd}$: resistance of contact to source/drain,
$\rho_{csd}$: resistivity of contact to source/drain
$\rho_0$: intrinsic resistivity of metal silicide
$m*$: effective mass of charge carrier
$\Phi_{SBH}$: Schottky barrier height between silicide-epi
N: effective carrier concentration
A: contact area
h: Plank constant Because P-type epitaxial layers have higher work functions, the work function of the metal silicide for P-type epitaxial layers needs to be higher to reduce the Schottky barrier height (SBH) to reduce resistance of contact to source/drain for PFET. Therefore, in order to optimize the reduction in the electrical resistivity for contacts, it is desirable for PFET devices to have higher work function metal silicides than NFETs. Some conventional FinFET devices may form different types of metal silicides for the PFETs and NFETs. Unfortunately, the fabrication of these types of conventional FinFET devices requires the use of multiple lithography masks and extra lithography processes to achieve the different types of metal silicides for PFETs and NFETs. Consequently, fabrication is more complex and more costly. In many cases, the cost of additional lithography processes and masks may outrun the benefits of having type-specific metal silicides. As a result, some other conventional devices employ the same type of metal silicide materials for both NFETs and PFETs, which may lead to high parasitic resistance and is therefore undesirable.

To overcome the problems discussed above, the present disclosure utilizes a novel fabrication process flow to selectively form different types of metal silicides to interface the source/drains of PFETs and NFETs, without requiring extra lithography masks and the accompanying extra lithography steps. Advantageously, the fabrication processes of the present disclosure can achieve one type of metal silicides for PFETs, and another type of metal silicides for NFETs (referred to as dual silicides). For example, the different types of metal silicide materials are grown selectively over the source/drains for PFETs and NFETs. The metal silicides for the PFETs have a greater work function than the metal silicides for the NFETs. This helps to optimize the reduction in electrical resistivity for contacts.

The various aspects of the present disclosure are discussed below in more detail with reference to the flow chart of a method 200 in FIG. 2 and fragmentary cross-sectional side views of FinFET devices at various stages of fabrication in FIGS. 3A, 3B, 4A, 4B, 5A, 5B, 6A, 6B, 7A, 7B, 8A, 8B, 9A, 9B, 10, and 11. FIGS. 3A, 4A, 5A, 6A, 7A, 8A, 9A, 10, and 11 each illustrate a cross-sectional view along section A-A' of a FinFET device, as exemplarily shown in FIG. 1. FIGS. 3B, 4B, 5B, 6B, 7B, 8B, and 9B each illustrate a cross-sectional view along section B-B' of a FinFET device, as exemplarily shown in FIG. 1.

Figure 2:
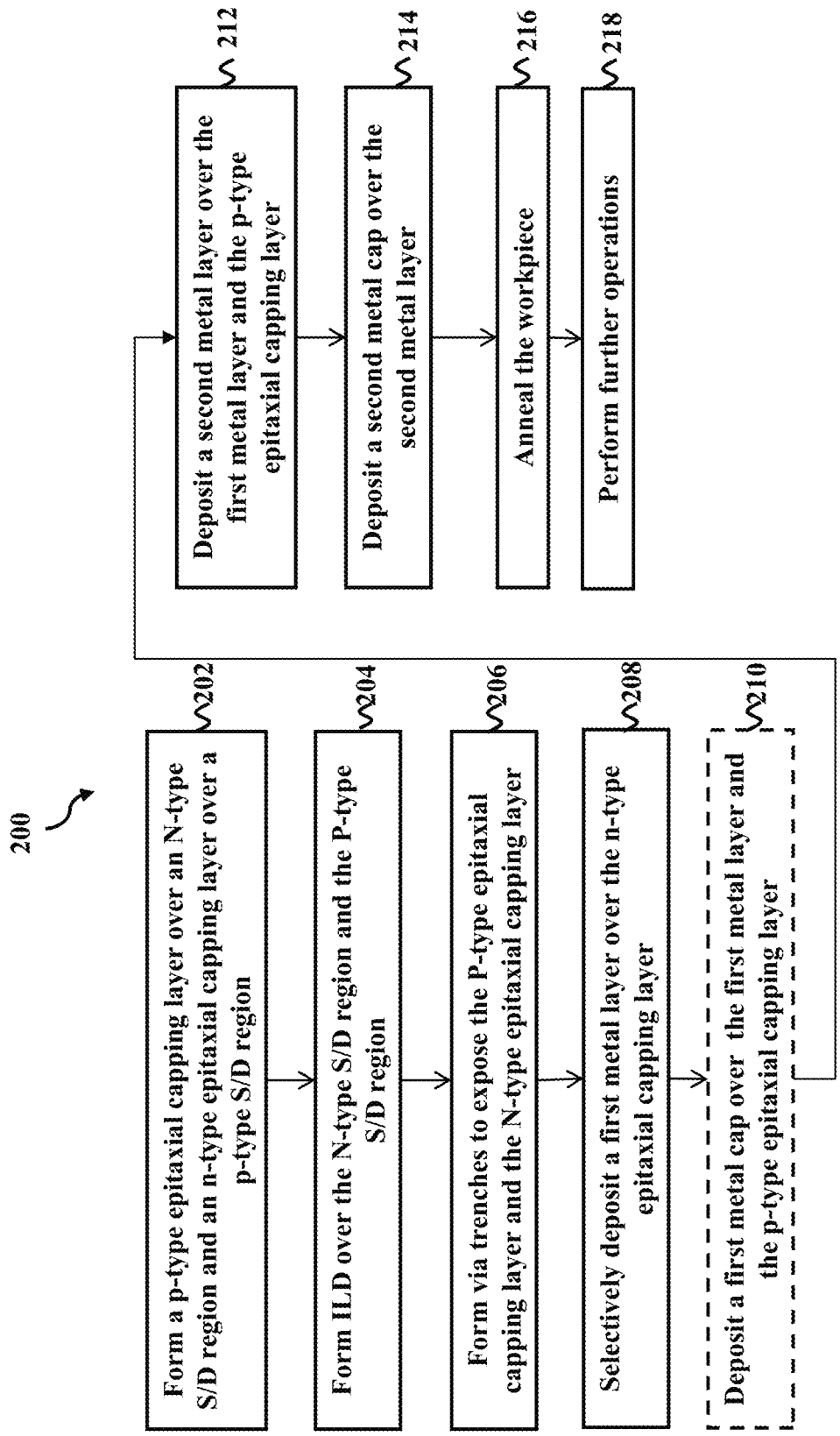

FIG. 2 is a flowchart illustrating the method 200 according to an embodiment of the present disclosure. The method 200 includes blocks 202, 204, 206, 208, 210, 212, 214, 216, and 218, with block 210 being optional. Additional steps can be provided before, during, and after method 200, and some of the steps described can be moved, replaced, or eliminated for additional embodiments of method 200. Method 200 in FIG. 2 will be described in conjunction with FIGS. 3A, 3B, 4A, 4B, 5A, 5B, 6A, 6B, 7A, 7B, 8A, 8B, 9A, 9B, and 10 below.

Figures 3A, 3B:
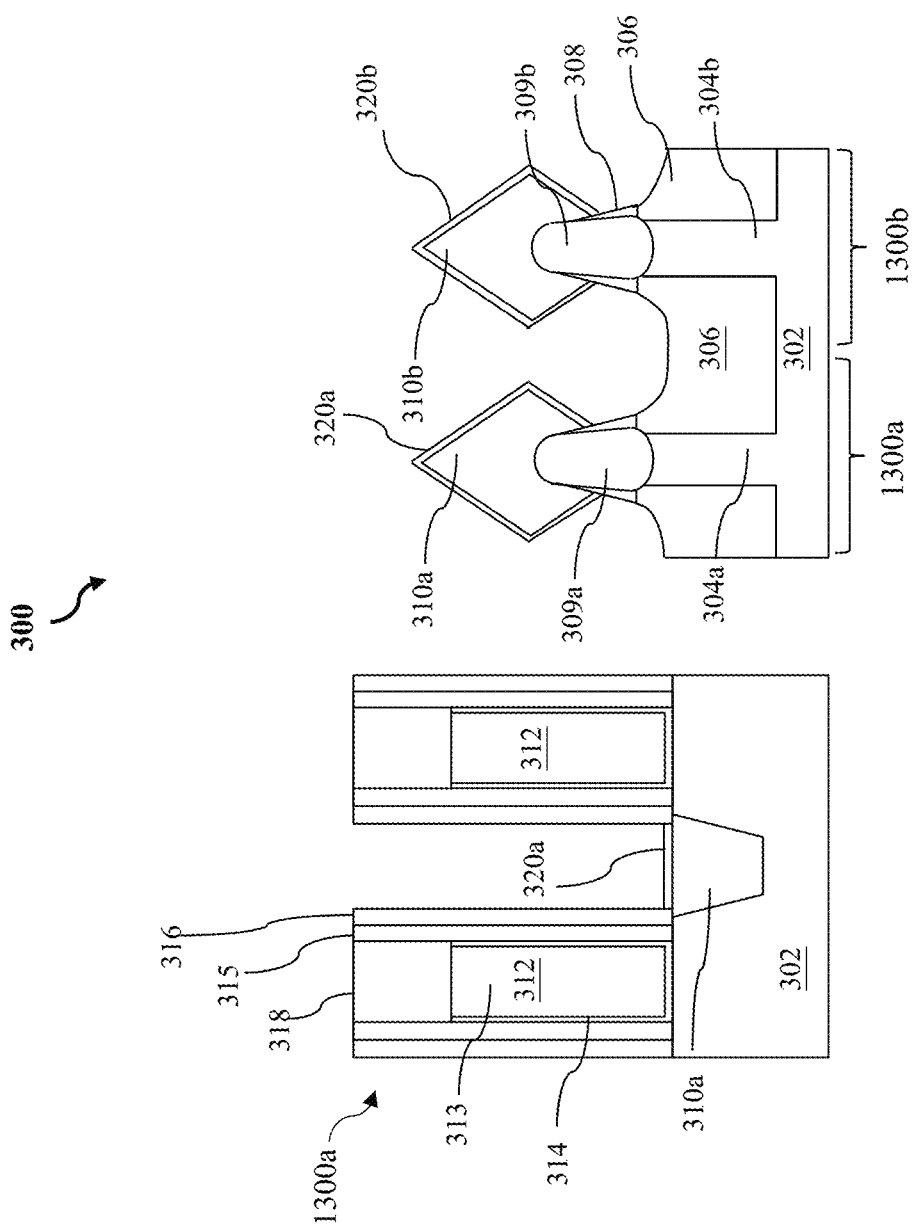

Referring to FIGS. 2, 3A and 3B, method 200 includes block 202 where a P-type epitaxial capping layer 320a is formed over an N-type S/D region 304a and an N-type epitaxial capping layer 320b is formed over a P-type S/D region 304b. In some embodiments, the N-type S/D region 304a and the P-type S/D region 304b are disposed on a workpiece 300. In some embodiments, an NFET 1300a and a PFET 1300b may be formed on the workpiece 300. For simplicity, only cross-section along section A-A' of NFET 1300a is shown in FIG. 3A, as well as in FIGS. 4A, 5A, 6A, 7A, 8A, 9A, 9B, and 10. The NFET 1300a and PFET 1300b are FinFET transistors but it is understood that they may be non-FinFET transistors such as planar transistors in other embodiments.

The NFET 1300a and PFET 1300b each include a substrate 302. The substrate 302 may be implemented as an embodiment of the substrate 102 discussed above with reference to FIG. 1. In some embodiments, the substrate 302 may include a portion of the fin structures. In some embodiments, the substrate 302 for the NFET 1300a includes a semiconductive material (or a semiconductor material), including but not limited to crystal silicon (Si), silicon phosphide (SiP), silicon carbide (SiC), silicon phosphorous carbide (SiPC), or a III-V group material such as indium phosphide (InP), gallium arsenide (GaAs), aluminum arsenide (AlAs), indium arsenide (InAs), indium aluminum arsenide (InAlAs), or indium gallium arsenide (InGaAs). In some embodiments, the substrate 302 for the PFET 1300b includes a semiconductive material, including but not limited to Si, silicon germanium (SiGe), silicon germanium boron (SiGeB), germanium, or a III-V group material such as indium antimonide (InSb), gallium antimonide (GaSb), indium gallium antimonide (InGaSb).

An ion implantation process may be performed to implant a plurality of dopant ions to the substrate 302. The dopant ions may include an N-type material for the NFET 1300a, for example arsenic (As) or phosphorous (P), or the dopant ions may include a P-type material for the PFET 1300b, for example boron (B). After the implantation process is performed, a doping concentration level in the substrate 302 may be in a range from about $1 \times 10^{17}$ ions/cm$^3$ to about $5 \times 10^{19}$ ions/cm$^3$.

The NFET 1300a in FIG. 3A includes an N-type S/D region 304a and an N-type S/D feature 310a over the N-type S/D region 304a. Similarly, the PFET 1300b includes a P-type S/D region 304b and a S/D feature 310b over the P-type S/D region 304b. The N-type and P-type S/D regions 304a and 304b have different material compositions or dopants. In some embodiments, the N-type S/D region 304a of the NFET 1300a may include silicon phosphide (SiP), and the P-type S/D region 304b of the PFET device may include boron doped silicon germanium (SiGeB). In other embodiments, the N-type and P-type S/D regions 304a and 304b may include the various materials of the substrate 302 of the NFET 1300a and the PFET 1300b discussed above, respectively. In some embodiments represented in FIGS. 3A and 3B, the N-type and P-type S/D regions 304a and 304b may be recessed. In some implementations, a contact etch stop layer (CESL) or an etch stop layer (ESL) 308 may be deposited over the N-type and P-type S/D regions 304a and 304b before the recess. As shown in FIG. 3B, a portion of the CESL 308 may remain on sidewalls of the N-type and P-type S/D regions 304a and 304b that protrude over the isolation feature 306 (or STI 306). After the recess, the N-type and P-type S/D features 310a and 310b may be epitaxially grown on the recessed N-type and P-type S/D regions 304a and 304b, respectively. In some embodiments, transition epitaxial features (a N-type transition S/D feature 309a and a P-type transition S/D feature 309b) may be epitaxially grown on the N-type S/D region 304a and P-type S/D region 304b before N-type and P-type S/D features 310a and 310b are formed. In some instances, the N-type transition S/D feature 309a may include less N-type doping than the N-type S/D feature 310a and the P-type transition S/D feature 309b may include less Ge and less P-type doping than the P-type S/D feature 310b.

The NFET 1300a and the PFET 1300b each include gate structures 312 disposed over the substrate 302, for example over channel regions of the substrate 302. The gate structures 312 each include a gate dielectric 314 and a gate electrode 313 formed over the gate dielectric 314. In some embodiments, the gate dielectric 314 contains silicon oxide, and the gate electrode 313 contains polysilicon. In other embodiments, a gate-replacement process may also be used to form high-k metal gates as the gate structures 312. In those embodiments, the gate dielectric 314 contains a high-k dielectric material, and the gate electrode 313 contains a metal material. A high-k dielectric material is a material having a dielectric constant that is greater than a dielectric constant of $SiO_2$, which is approximately 4. For example, the high-k dielectric material may include hafnium oxide ($HfO_2$), which has a dielectric constant that is in a range from approximately 18 to approximately 40. Alternatively, the high-k material may include one of ZrO, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof.

The metal material of the gate electrode 313 may include a work function metal component and a fill metal component. The work function metal component tunes a work function of the respective transistor device (e.g., either the NFET 1300a or the PFET 1300b) so that a desired threshold voltage Vt is achieved. The fill metal component of the metal gate electrode serves as the main conductive portion of the gate electrode. The fill metal component may include tungsten, aluminum, copper, or combinations thereof. For the sake of simplicity, the gate dielectric, the work function metal component, and the fill metal component of the gate structures 312 are not separately drawn in the figures herein.

In the aforementioned gate-replacement process, a dummy gate electrode (e.g., made of polysilicon) may be formed on the high-k dielectric. After the formation of the N-type and P-type S/D features 310a and 310b over the S/D regions 304a and 304b, the dummy gate electrode may be removed and replaced by the gate electrode 313 discussed above. This is referred to as a gate-last process flow. In some embodiments, the gate-replacement process may also employ a high-k last process flow, in which a dummy oxide dielectric is formed in place of the high-k dielectric. A dummy polysilicon gate electrode is formed on the dummy oxide gate dielectric. After the formation of the N-type and P-type S/D features 310a and 310b over the N-type and P-type S/D regions 304a and 304b, the dummy oxide gate dielectric is removed along with the dummy polysilicon gate electrode. The high-k gate dielectric and the metal gate electrode may then be formed to replace the removed dummy gate dielectric and dummy gate electrode.

The NFET 1300a and the PFET 1300b each include gate spacers 315 and 316 that are disposed on sidewalls of the gate structures 312. The gate spacers 315 and 316 may include a dielectric material, for example silicon oxide, silicon nitride, silicon oxynitride, or a low-k dielectric material in various embodiments. In some embodiments, the gate spacer 315 and gate spacer 316 may be formed of different dielectric materials. An inter-layer (or inter-level) dielectric (ILD) layer is formed over the gate structures 312 and over the gate spacers 315 and 316. The ILD layer may be formed by chemical vapor deposition (CVD), high density plasma CVD, spin-on, sputtering, or other suitable methods. In some embodiments, the ILD layer includes silicon oxide. In other embodiments, the ILD layer may include silicon oxycarbide, zirconium oxide, hafnium oxide, a low-k material, or a high-k material. In some implementations, a gate cap 318 may be formed over the gate structures 312. In some examples, the gate cap 318 includes silicon oxycarbonitride.

In the embodiments represented in FIGS. 3A and 3B, the P-type epitaxial capping layer 320a is formed on the N-type S/D feature 310a over the N-type S/D region 304a and the N-type epitaxial capping layer 320b is formed on the P-type S/D feature 310b over the P-type S/D region 304b. In some embodiments, the P-type epitaxial capping layer 320a is epitaxially grown on the N-type S/D feature 310a after the N-type S/D feature 310a is formed; and the N-type epitaxial capping layer 320b is epitaxially grown on the P-type S/D feature 310b after the P-type S/D feature 310b is formed. In some implementations, the N-type epitaxy (i.e. N-type S/D feature 310a and the N-type epitaxial capping layer 320b) and the P-type epitaxy (i.e. P-type S/D feature 310b and the P-type epitaxial capping layer 320a) are formed in different chambers of a process tool, such as a CVD tool or an ALD tool. In those implementations, after N-type S/D feature 310a is formed on the workpiece 300 in the N-type epitaxy chamber, the workpiece 300 is transferred to the P-type epitaxy chamber for the P-type epitaxial capping layer 320a, without breaking the vacuum. Similarly, after P-type S/D feature 310b is formed on the workpiece 300 in the P-type epitaxy chamber, the workpiece 300 is transferred to the N-type epitaxy chamber for the N-type epitaxial capping layer 320b, without breaking the vacuum. For example, the N-type S/D feature 310a may be formed by epitaxially growing Si in the N-type epitaxy chamber using a Si precursor over the N-type S/D region 304a while doping the epitaxially grown Si in situ with an N-type dopant, such as phosphorous (P). After the SiP N-type S/D feature 310a is formed, the workpiece 300 is transferred to the P-type epitaxy chamber where the P-type epitaxial capping layer 320a is epitaxially grown on the N-type S/D feature 310a using a Si/Ge precursor or a Ge precursor. In these instances, the P-type epitaxial capping layer 320a may be formed essentially of SiGe or essentially of Ge. In a similar fashion, the P-type S/D feature 310b may be formed by epitaxially growing SiGe in the P-type epitaxy chamber using a Si precursor and a Ge precursor over the P-type S/D region 304b while doping the epitaxially grown SiGe in situ with a P-type dopant, such as boron (B). After the SiGeB P-type S/D feature 310b is formed, the workpiece 300 is transferred to the N-type epitaxy chamber where the N-type epitaxial capping layer 320b is epitaxially grown on the P-type S/D feature 310b using a Si precursor. In these instances, the N-type epitaxial capping layer 320b consists essentially of Si. In some implementations, an N-type dopant, such as phosphorous (P), may be in-situ doped when the N-type epitaxial capping layer 320b is formed. In those implementations, the N-type epitaxial capping layer 320b consists essentially of SiP.

Because block 202 will result in a P-type epitaxial capping layer 320a on the N-type S/D feature 310a and an N-type epitaxial capping layer 320b on the P-type S/D feature 310b, the operations in block 202 may be referred to as reverse epitaxial capping. As these reverse epitaxially capping layers, if present in the final structures, may increase contact resistance and impact performance of the resultant device, they may be formed to a sufficiently thin thickness such that they can enter a metal lattice when a metal silicide is formed thereover, according to the present disclosure. That is, such sufficiently thin thicknesses allows the reverse epitaxial capping layers to be fully consumed by the later-forming metal silicides/germanides. In that regard, in some instances, the P-type epitaxial capping layer 320a may be formed to a thickness between about 1 nm and about 3 nm; and the N-type epitaxial capping layer 320b may be formed to a thickness between about 1 nm and about 3 nm.

Figures 4A, 4B:
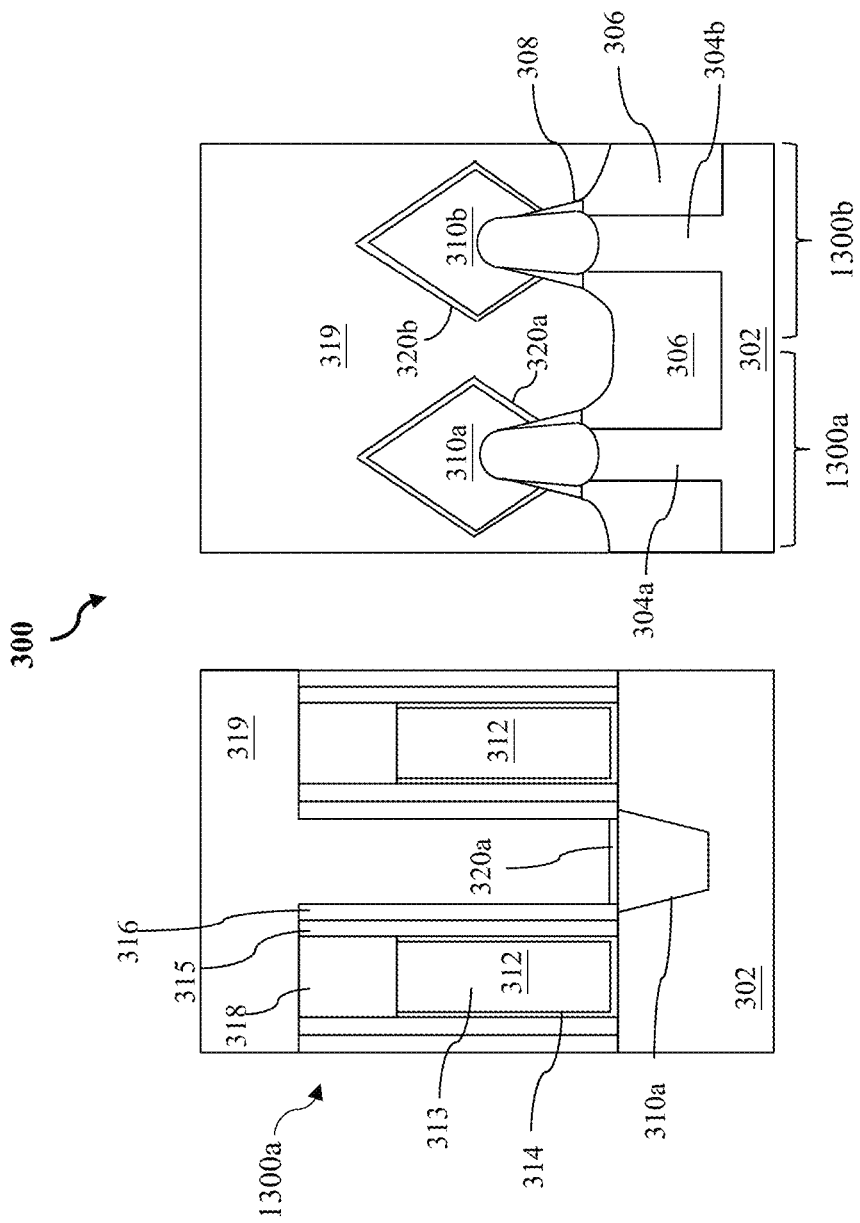

Referring to FIGS. 2, 4A and 4B, method 200 includes block 204 where a dielectric material is deposited over the workpiece 300 to form an interlayer dielectric layer (ILD) 319. In some implementations, the dielectric material of the ILD 319 may include, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SILK (Dow Chemical, Midland, Michigan), polyimide, other low-k dielectric material, or combinations thereof. In some implementations, the ILD 319 may have a multilayer structure having multiple dielectric materials. In some instances, an etch stop layer (ESL) is deposited over the workpiece 300 before the ILD 319 is formed over the workpiece 300. The ESL facilitates control of the etching process to form via trenches through the ILD 319 at block 206, to be described below. In some implementations, the ESL is formed of a dielectric material that includes Si and N, such as silicon nitride.

Figures 5A, 5B:
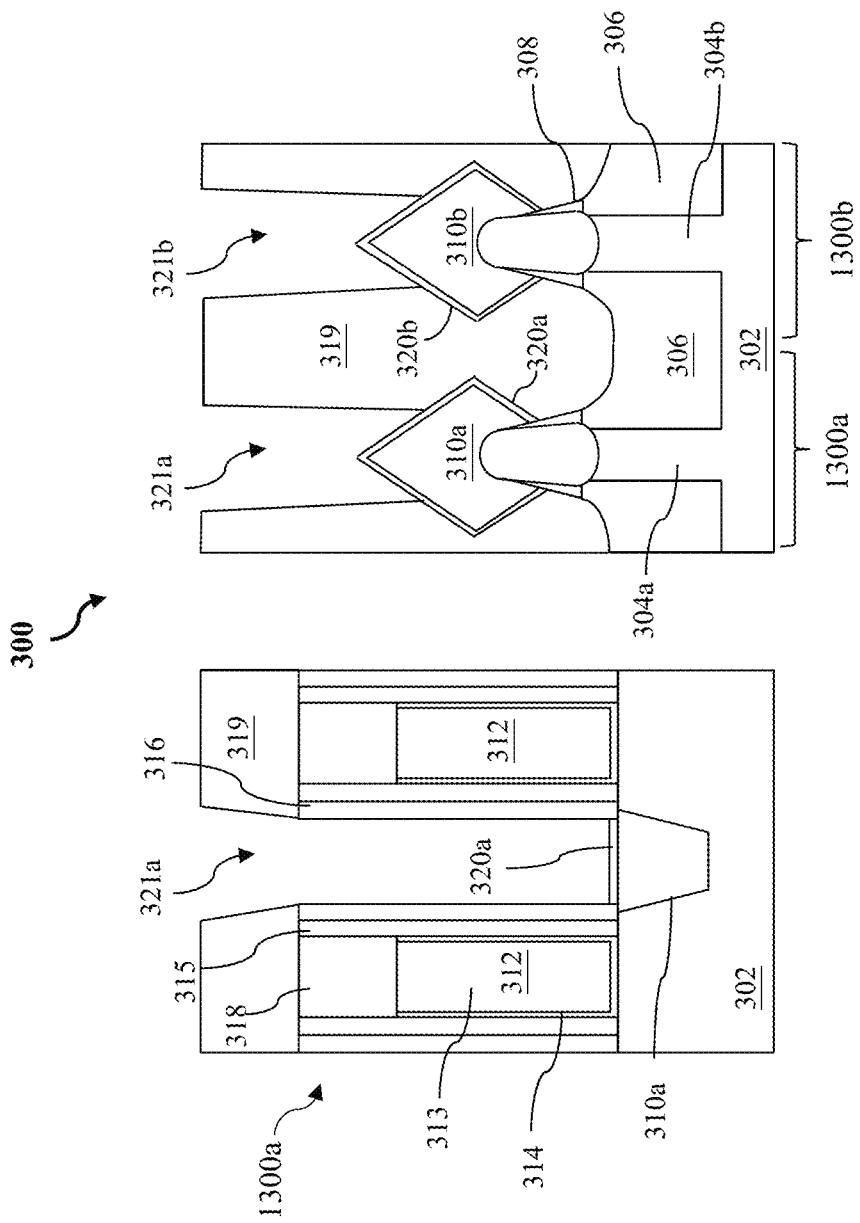

Referring to FIGS. 2, 5A and 5B, method 200 includes block 206 where via trenches 321a and 321b are formed through the ILD 319 to expose the P-type epitaxial capping layer 320a and the N-type epitaxial capping layer 320b. In embodiments represented in FIGS. 5A and 5B, the via trench 321a exposes the P-type epitaxial capping layer 320a and the via trench 321b exposes the N-type epitaxial capping layer 320b. In some embodiments, the via trenches 321a and 321b are formed using suitable photolithography processes, where an etching mask formed of photoresists and hard mask layers is used to etch the ILD 319. The etching may be performed using suitable etching techniques, such as dry etch and in some instances, plasma is used to achieve anisotropic etching through the ILD 319. In some implementations, the ESL described above with respect to block 204 may slows down the etching process as the etching approaches the P-type epitaxial capping layer 320a and the N-type epitaxial capping layer 320b.

In some embodiments, after the via trenches 321a and 321b are formed at block 206, a liner may be formed over the workpiece 300, including over top surfaces of the ILD 319 and bottom surfaces and sidewalls of the via trenches 321a and 321b. The liner may be formed of an oxygen-atom-free dielectric material and serves to prevent oxygen atoms from oxidizing the metallic materials to be filled in the trenches vias 321a and 321b. In some instances, the liner may be formed of silicon nitride. After the liner is formed over the workpiece 300, an isotropic etch is performed to remove the liner from top-facing surfaces, such as the top surfaces of the ILD 319 and the bottom surfaces of the via trenches 321a and 321b.

Figure 12:
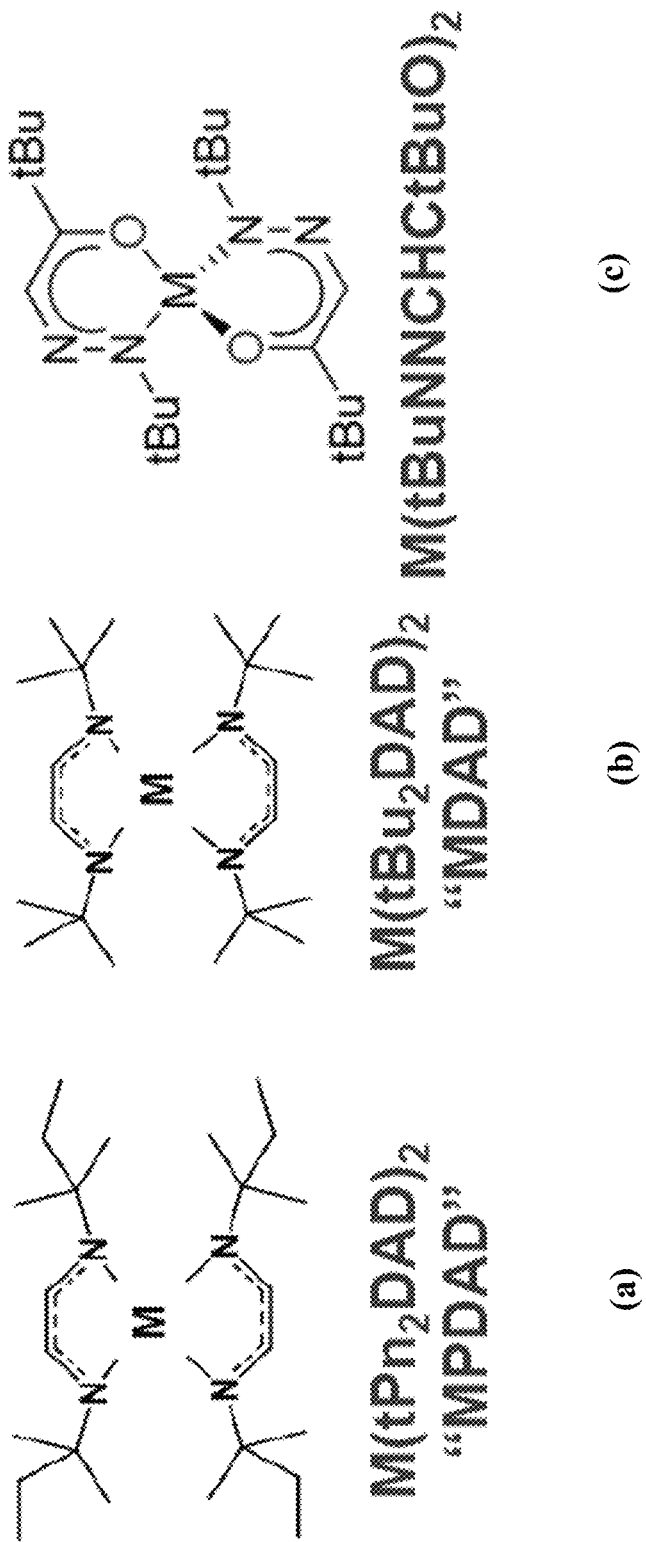

Referring to FIGS. 2, 6A and 6B, method 200 includes block 208 where a first metal layer 330 is selectively deposited over the N-type epitaxial capping layer 320b. In some embodiments, the first metal in the first metal layer 330 is a high work function metal and may be nickel (Ni), cobalt (Co), platinum (Pt), tungsten (W), ruthenium (Ru), or a combination thereof. Here, the high work function metal refers to a metal with a work function equal to or above about 4.5 eV. In some implementations, the first metal layer 330 may be deposited using CVD or ALD using a metal complex as a precursor. In some instances, the CVD or ALD for the operations at block 208 may be at a pressure between about 0.2 Torr and about 5 Torr. It has been observed that a high work function metal using a metal complex as a precursor can be preferentially deposited on a N-type epitaxial layer (such as the N-type epitaxial capping layer 320b), rather than a P-type epitaxial layer (such as the P-type epitaxial capping layer 320a). This preferential deposition is brought about at least partially by the strained nature of P-type epitaxial layer. For example, the P-type epitaxial capping layer 320a may be formed of SiGe with a Ge-to-Si ratio larger than 3:2. Because Si and Ge have different lattice constants, the heteroepitaxial SiGe lattice is strained. This built-in strain may be averse to adhesion of metal complexes and therefore to deposition of high work function metal using metal complexes as precursors. A metal complex according to the present disclosure may have general chemical formulae M (tAlkyl$_2$DAD)$_2$ (bis (1,4-di-t-alkyl$_2$-1,3-diazabutadienyl) M), M(tBuNNCHCtBuO)$_2$, M(cBuNNCHCiPrO)$_2$, and M(tBuNNCMcCMeO)$_2$, where M(tBuNNCHCtBuO)$_2$, M(cBuNNCHCiPrO)$_2$, and M(tBuNNCMeCMeO)$_2$ are hydrazone salts and M may be nickel (Ni), cobalt (Co), platinum (Pt), tungsten (W), ruthenium (Ru). Examples of metal complexes that can be used to selectively deposit the first metal layer 330 at block 208 are provided in FIG. 12. Metal complexes (a) and (b) are in the family of bis (1,4-di-t-alkyl$_2$-1,3-diazabutadienyl) M, where the alkyl group is pentyl in (a) and the alkyl group is butyl in (b). As described above, because the metal complex has a higher affinity to the N-type epitaxial capping layer 320b than to the P-type epitaxial capping layer 320a, substantially no or little first metal layer 330 may be formed on the P-type epitaxial capping layer 320a.

It is noted that, even without annealing, as the first metal layer 330 is deposited on the N-type epitaxial capping layer 320b by CVD or ALD using the metal complexes described above, the first metal may react with silicon in the N-type epitaxial capping layer 320b, such that at least a part of the N-type epitaxial capping layer 320b is substantially consumed (shown in dotted lines). For example, when the metal complex includes Ni or Co, nickel silicide or cobalt silicide may be formed when Ni (tAlkyl$_2$DAD)$_2$, Ni(tBuNNCHCtBuO)$_2$, Ni(cBuNNCHCiPrO)$_2$, Ni(tBuNNCMcCMcO)$_2$, Co (tAlkyl$_2$DAD)$_2$, Co(tBuNNCHCtBuO)$_2$, Co(cBuNNCHCiPrO)$_2$, or Co(tBuNNCMcCMeO)$_2$ is used as a precursor to form the first metal layer 330. Insofar as the first metal layer 330 becomes silicide as the first metal is deposited on the N-type epitaxial capping layer 320b, the first metal layer 330 and the N-type epitaxial capping layer 320b may be collectively referred to as the first metal silicide layer 330b. In some instances, due to lack of high temperature annealing, the first metal silicide layer 330b is amorphous and has a high resistance.

In some embodiments, while no or little of first metal layer 330 is deposited over the P-type epitaxial capping layer 320a, the first metal layer 330 may be formed over the surfaces of the ILD 319 and/or surfaces of the oxygen-atom-free liner. In some embodiments represented in FIGS. 6A and 6B, the first metal layer 330 on the ILD 319 (or the liner on the ILD 319) is not removed by selectively etching. In some alternative embodiments, the first metal layer 330 on the ILD 319 (or the liner on the ILD 319) is removed by selectively etching, such as a suitable wet etching process. In the selective etching, the first metal layer 330 is etched and the first metal silicide layer 330b is substantially unetched.

Method 200 optionally includes block 210 where a first metal cap is deposited the first metal silicide layer 330b and the P-type epitaxial capping layer 320a to protect the first metal silicide layer 330b. The first metal cap may be formed of metal nitride, such as titanium nitride (TIN). In some embodiments, the operations in block 210 may be omitted because material such as metal nitride has lower conductivity than metal silicide. When the first metal cap is formed at block 210, it is also formed over sidewalls of the via trenches 321a and 321b and may function as a barrier layer.

Figures 7A, 7B:
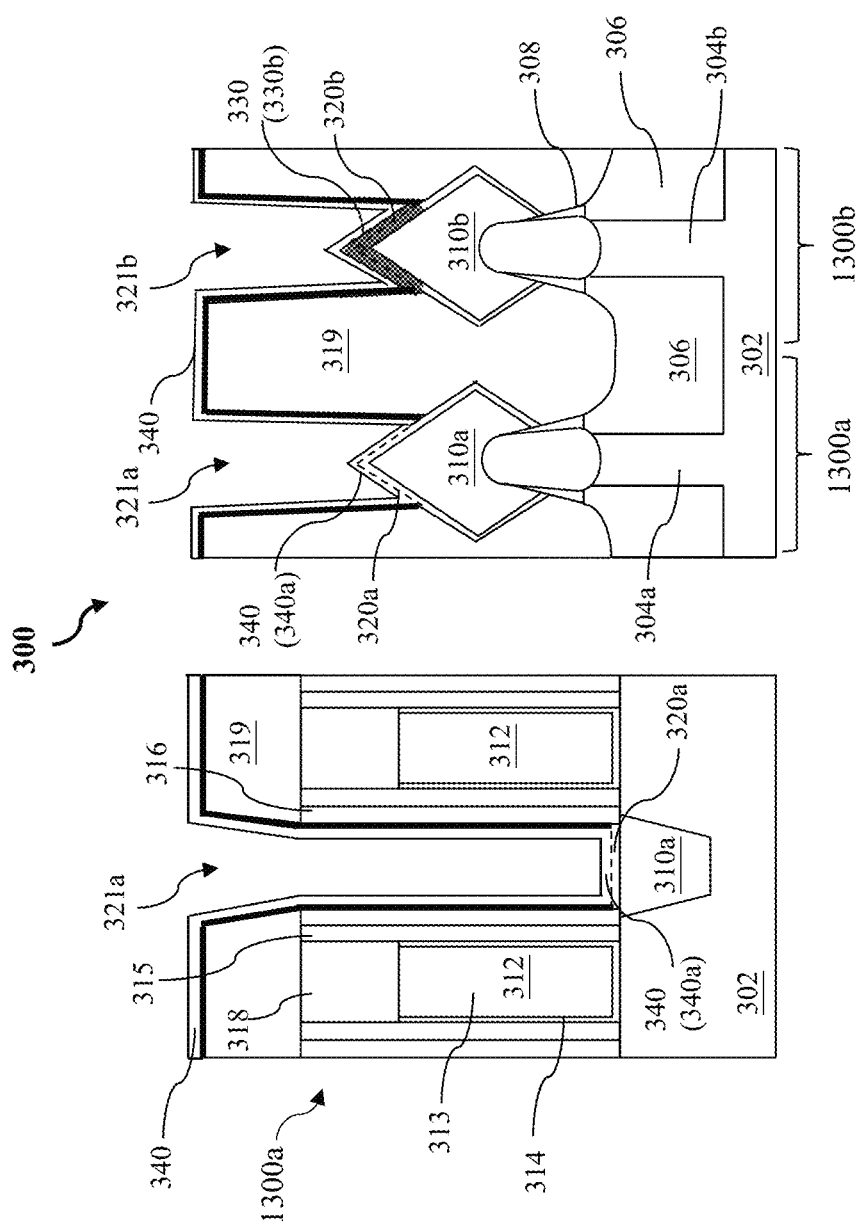

Referring to FIGS. 2, 7A and 7B, method 200 includes block 212 where a second metal layer 340 is deposited over the first metal layer 330 and the P-type epitaxial capping layer 320a. In some embodiments, the second metal in the second metal layer 340 is a low work function metal and may be titanium (Ti), erbium (Er), yttrium (Y), ytterbium (Yb), europium (Eu), terbium (Tb), lutetium (Lu), thorium (Th), scandium (Sc), hafnium (Hf) zirconium (Zr), tantalum (Ta), or a combination thereof. In some instances, the second metal layer 340 may consist essentially of titanium (Ti). Here, the low work function metal refers to a metal with a work function below about 4.5 eV. In some implementations, the second metal layer 340 may be deposited using CVD or ALD. For example, when the second metal layer 340 is formed of titanium, the second metal layer 340 may be formed using tetrakis(dimethylamino) titanium (TDMAT), tetrakis (diethylamino) titanium (TDEAT), or tetrakis (ethylmethylamino) titanium (TEMAT), or a combination thereof as a precursor. Because the deposition of the second metal layer 340 is not selective, the second metal layer 340 is deposited over the first metal layer 330 and the P-type epitaxial capping layer 320a. In some embodiments, even without annealing, as the second metal layer 340 is deposited on the P-type epitaxial capping layer 320a by CVD or ALD, the second metal may react with Si and Ge in the P-type epitaxial capping layer 320a, such that at least a part of the P-type epitaxial capping layer 320a is substantially consumed (shown in dotted lines). For example, when the second metal is titanium (Ti), titanium silicide and/or titanium germanide may be formed when the second metal layer 340 is being deposited on the P-type epitaxial capping layer 320a. Insofar as the second metal layer 340 becomes silicide/germanide as the second metal is deposited on the P-type epitaxial capping layer 320a, the second metal layer 340 and the P-type epitaxial capping layer 320a may be collectively referred to as the second metal silicide/germanide layer 340a. In some instances, due to lack of high temperature annealing, the second metal silicide/germanide layer 340a is amorphous and has a high resistance.

In some embodiments, the second metal layer 340 may be formed over the surfaces of the ILD 319 and/or surfaces of the oxygen-atom-free liner (when the first metal layer 330 on the ILD 319 and/or surfaces of the oxygen-atom-free liner is removed by selective etching) or the first metal layer 330 ((when the first metal layer 330 on the ILD 319 and/or surfaces of the oxygen-atom-free liner is not removed by selective etching). In some embodiments represented in FIGS. 7A and 7B, the second metal layer 340 on the first metal layer 330 ( ) is not removed by selectively etching. In some alternative embodiments, the second metal layer 340 on the first metal layer 330 (or the ILD 319 and/or surfaces of the oxygen-atom-free liner when the first metal layer 330 on the ILD 319 and/or surfaces of the oxygen-atom-free liner is removed by selective etching) is removed by selectively etching, such as a suitable wet etching process. In the selective etching, the second metal layer 340 is etched while the second metal silicide/germanide layer 340a is substantially unetched.

Figures 8A, 8B:
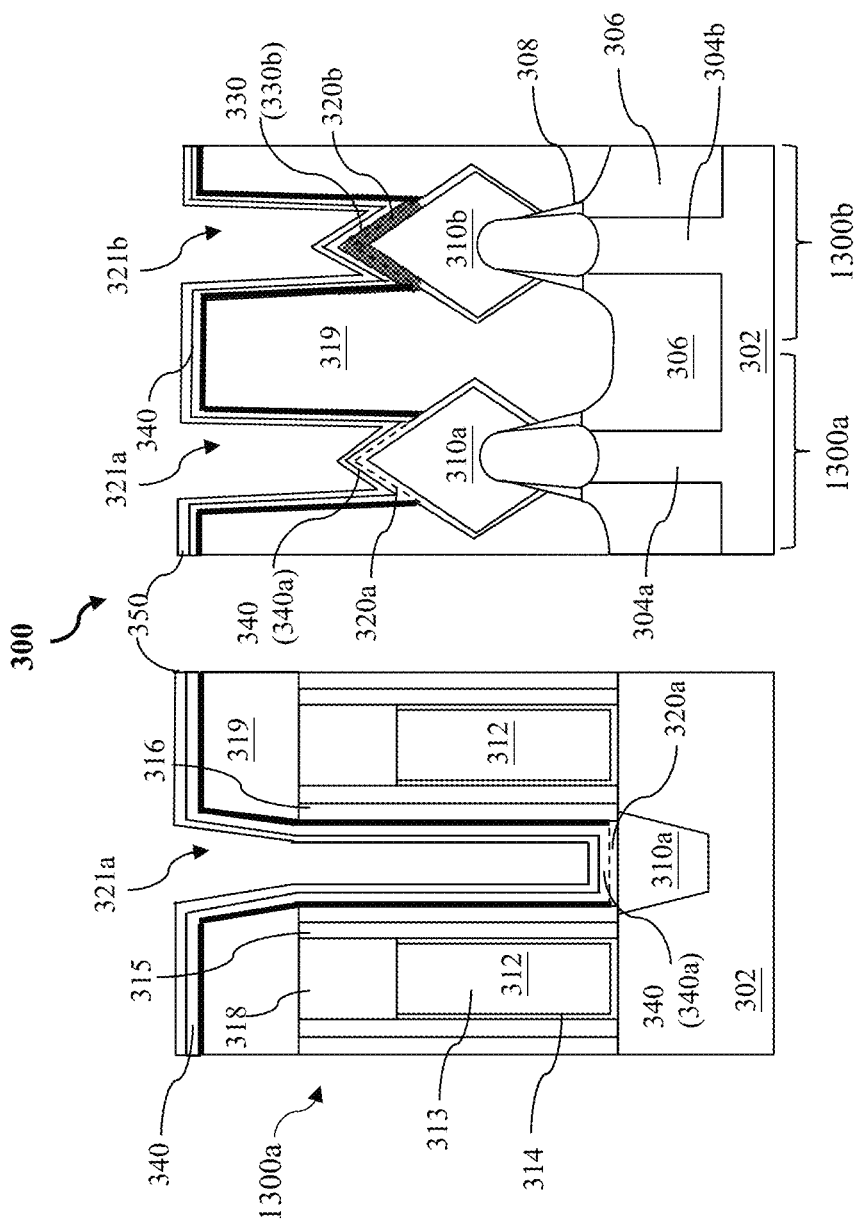

Referring to FIGS. 2, 8A and 8B, method 200 includes block 214 where a second metal cap 350 is deposited over the second metal layer 340 and the second metal silicide/germanide layer 340a to protect the second metal silicide/germanide layer 340a. In embodiments represented in FIG. 8A, the second metal cap 350 is formed conformally over top surfaces and sidewalls of the gate structures 312. In some implementations, the second metal cap 350 may be formed of titanium nitride (TiN) and the portion of the second metal cap 350 on sidewalls of the via trenches 321a and 321b may serve as a barrier layer to prevent oxygen from diffusing into the metallic material to be filled in the via trenches 321a and 321b. To prevent the relatively high resistivity of the second metal cap from impacting the overall resistance of the contact structure, the second metal cap 350 is thin and has a thickness between about 1 nm and about 3 nm.

Referring to FIGS. 2, 9A, and 9B, method 200 includes block 216 where the workpiece 300 is annealed in an annealing process 400. In some embodiment, the temperature of the annealing process 400 is selected to convert the amorphous, high-resistance first metal silicide layer 330b and second metal silicide/germanide layer 340a in FIGS. 8A and 8B into polycrystalline, low-resistance first metal silicide layer 330b' (or first metal silicide polycrystallite layer 330b') and polycrystalline, low-resistance second metal silicide/germanide layer 340a' (or second metal silicide/germanide polycrystallite layer 340a') in FIGS. 8A and 8B. The annealing temperature of the annealing process 400 depends on the higher of the annealing temperatures of the first metal silicide layer 330b and the second metal silicide/germanide layer 340a. For example, if the annealing temperature required to convert the first metal silicide layer 330b to its polycrystalline form 330b' (first metal silicide polycrystallite layer 330b') is 350° C. and the annealing temperature required to convert the second metal silicide/germanide layer 340a to its polycrystalline form 340a' (second metal silicide/germanide polycrystallite layer 340a') is 700° C., then the annealing temperature selected for the annealing process 400 is 700° C.

Referring to FIGS. 2, 10 and 11, method 200 includes block 218 where further operations are performed. Such further operations may include, for example, deposition of a contact metal (plug metal) to form S/D contact and planarization to remove the excess material. For example, a contact metal material may be deposited over the workpiece 300, including into and over the via trenches 321a and 321b, to form the contact metal layer 360, shown in FIG. 10. Further, in FIG. 11, a planarization process, such as chemical mechanical polishing (CMP) is performed to remove excess material such that the top surfaces of the gate cap 318, gate spacers 315 and 316, contact metal layer 360, second metal cap 350, and second metal layer 340 are coplanar. Additional processes may also be performed.

The selective deposition of the first metal does not need lithography masks to achieve the selective formation of the first metal layer 330, which simplifies fabrication. In some embodiments, because the first metal complex of the present disclosure has a higher affinity to the N-type epitaxial features than to the P-type epitaxial features, the first metal complex may be selectively deposited on the N-type reverse epitaxial capping layer on the P-type epitaxial feature to form the first metal layer without being substantially deposited on P-type reverse epitaxial capping layer on the N-type epitaxial features. The P-type reverse epitaxial capping serves to prevent the formation of first metal silicide for the NFET 1300a when the first metal silicide is formed for the PFET 1300b.

Based on the above discussions, it can be seen that the present disclosure offers advantages over conventional FinFET fabrication. It is understood, however, that other embodiments may offer additional advantages, and not all advantages are necessarily disclosed herein, and that no particular advantage is required for all embodiments. One advantage is that the NFET silicide and the PFET silicide have different material compositions and different work functions, for example the PFET silicide can be formed to have a higher work function than the NFET silicide. This reduces the resistivity of the conductive contacts formed over the silicides. Another advantage is that since the formation of the dual silicides (for both NFET and PFET) does not require extra masks, it simplifies the fabrication process flow and therefore reduces cost. Other advantages include compatibility with existing fabrication processes, so the present disclosure is therefore easy and convenient to implement.

It is understood that the present disclosure is not limited to FinFET devices and may apply to planar devices as well.

One aspect of the present disclosure pertains to a method of fabricating a semiconductor device. The method includes forming a first type epitaxial layer over a second type source/drain feature of a second type transistor, forming a second type epitaxial layer over a first type source/drain feature of a first type transistor, selectively depositing a first metal over the first type epitaxial layer to form a first metal layer while the first metal is substantially not deposited over the second type epitaxial layer over the first type source/drain feature, and depositing a second metal over the first metal layer and the second type epitaxial layer to form a second metal layer.

In some embodiments, the method of the present disclosure further includes forming a metal cap layer over the second metal layer. In some other embodiments, the method may further include performing an annealing to form a first metal silicide polycrystallite out of the first metal layer and the first type epitaxial layer and to form a second metal silicide/germanide polycrystallite out of the second metal layer and the second type epitaxial layer. In some instances, the forming of the first type epitaxial layer includes forming the first type epitaxial layer to a first thickness such that the first type epitaxial layer is consumed after the first metal silicide polycrystallite is formed. In some examples, the forming of the second type epitaxial layer includes forming the second type epitaxial layer to a second thickness such that the second type epitaxial layer is consumed after the second metal silicide/germanide polycrystallite is formed. In some embodiments, the first type epitaxial layer is an N-type epitaxial layer comprising silicon and the second type epitaxial layer is a P-type epitaxial layer comprising germanium. In some implementations, the first metal includes nickel (Ni), cobalt (Co), platinum (Pt), tungsten (W), ruthenium (Ru), or a combination thereof, and the second metal includes titanium (Ti), erbium (Er), yttrium (Y), ytterbium (Yb), europium (Eu), terbium (Tb), lutetium (Lu), thorium (Th), scandium (Sc), hafnium (Hf) zirconium (Zr), tantalum (Ta), or a combination thereof. In some embodiments, the selectively depositing the first metal includes performing a chemical vapor deposition (CVD) or atomic layer deposition (ALD) using a metal complex comprising M (tAlkyl2DAD)$_2$, M(tBuNNCHCtBuO)$_2$, M(cBuNNCHCiPrO)$_2$, and M(tBuNNCMeCMeO)$_2$. M is selected from the group consisting of nickel (Ni), cobalt (Co), platinum (Pt), tungsten (W), ruthenium (Ru), and a combination thereof.

Another one aspect of the present disclosure pertains to a method of fabricating a semiconductor device. The method includes forming an N-type epitaxial layer over a P-type source/drain feature of a P-type transistor, forming a P-type epitaxial layer over an N-type source/drain feature of an N-type transistor, selectively depositing a high work function metal over the N-type epitaxial layer to form a high work function metal layer while the high work function metal layer is substantially not deposited over the P-type epitaxial layer over the N-type source/drain feature, and depositing a low work function metal over the high work function metal layer and the P-type epitaxial layer to form a low work function metal layer. The high work function metal includes a work function equal to or above about 4.5 eV and the low work function metal includes a work function below about 4.5 eV.

In some embodiments, the method includes forming a metal nitride layer over the low work function metal layer. In some implementations, the method further includes performing an annealing to form a high work function metal silicide polycrystallite layer out of the high work function metal layer and the N-type epitaxial layer and to form a low work function metal silicide polycrystallite layer out of the low work function metal layer and the P-type epitaxial layer.

In some instances, the forming of the N-type epitaxial layer includes forming the N-type epitaxial layer to a first thickness such that the N-type epitaxial layer is consumed after the high work function metal silicide polycrystallite layer is formed. In some embodiments, the forming of the P-type epitaxial layer in the method includes forming the P-type epitaxial layer to a second thickness such that the P-type epitaxial layer is consumed after the low work function metal silicide polycrystallite layer is formed. In some implementations, the N-type epitaxial layer includes silicon and the P-type epitaxial layer includes germanium. In some embodiments, the high work function metal includes nickel (Ni), cobalt (Co), platinum (Pt), tungsten (W), ruthenium (Ru), or a combination thereof, and the low work function metal includes titanium (Ti), erbium (Er), yttrium (Y), ytterbium (Yb), europium (Eu), terbium (Tb), lutetium (Lu), thorium (Th), scandium (Sc), hafnium (Hf) zirconium (Zr), tantalum (Ta), or a combination thereof. In some instances, the selectively depositing the high work function metal of the method includes performing a chemical vapor deposition (CVD) or atomic layer deposition (ALD) using an organometallic compound comprising bis (1,4-di-t-alkyl-1,3-diazabutadienyl) cobalt (II), bis (1,4-di-t-alkyl-1,3-diazabutadienyl) nickel (II), cobalt hydrazonate salt, or nickel hydrazonate salt.

Yet another aspect of the present disclosure pertains to a semiconductor device. The semiconductor device includes an N-type field effect transistor (NFET) and a P-type (PFET). The NFET includes a first source/drain region, and a first metal germanide layer disposed over the first source/drain region. The PFET includes a second source/drain region, a second metal silicide layer disposed over the second source/drain region, and a first metal layer over the second metal silicide layer. The first metal germanide layer includes a first metal. The second metal silicide layer includes a second metal different than the first metal, and the first metal layer comprising the first metal.

In some embodiments, the first metal in the semiconductor device is the first metal is a low work function metal comprising titanium (Ti), erbium (Er), yttrium (Y), ytterbium (Yb), europium (Eu), terbium (Tb), lutetium (Lu), thorium (Th), scandium (Sc), hafnium (Hf) zirconium (Zr), tantalum (Ta), or combination thereof. In some implementations, the second metal is a high work function metal including nickel (Ni), cobalt (Co), platinum (Pt), tungsten (W), ruthenium (Ru), or a combination thereof. In some instances, the first metal germanide layer includes TiGe, the first metal layer includes Ti, the second metal silicide layer includes CoSi, the second metal includes Co, and the NFET is substantially free of CoSi over the first source/drain region.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors.

However, other techniques to vary the resistances of the metal conductors may also be utilized as well.

What is claimed is:

1. A method of fabricating a semiconductor device, comprising:
   forming an n-type source/drain feature over a first fin and a p-type source/drain feature over a second fin;
   selectively depositing a p-type epitaxial capping layer over the n-type source/drain feature;
   selectively depositing an n-type epitaxial capping layer over the p-type source/drain feature;
   depositing a dielectric layer over the p-type epitaxial capping layer and the n-type epitaxial capping layer;
   forming a first opening through the dielectric layer to expose the p-type epitaxial capping layer;
   forming a second opening through the dielectric layer to expose the n-type epitaxial capping layer;
   selectively depositing a first metal layer over the second opening to contact the n-type epitaxial capping layer;
   depositing a second metal layer over the first opening and the second opening to contact the p-type epitaxial capping layer and the first metal layer;
   depositing a capping layer over the second metal layer;
   after the depositing of the capping layer, annealing the n-type source/drain feature and the p-type source/drain feature; and
   after the annealing, deposit a contact metal layer of the capping layer.

2. The method of claim 1, wherein the n-type source/drain feature comprises phosphorus doped silicon.

3. The method of claim 1, wherein the p-type source/drain feature comprises boron-doped silicon germanium.

4. The method of claim 1, wherein the p-type epitaxial capping layer comprises silicon germanium or germanium.

5. The method of claim 1, wherein the n-type epitaxial capping layer comprises silicon.

6. The method of claim 1, wherein the first metal layer comprises nickel (Ni), cobalt (Co), platinum (Pt), tungsten (W), or ruthenium (Ru).

7. The method of claim 1, wherein the second metal layer comprises titanium (Ti), erbium (Er), yttrium (Y), ytterbium (Yb), europium (Eu), terbium (Tb), lutetium (Lu), thorium (Th), scandium (Sc), hafnium (Hf) zirconium (Zr), tantalum (Ta), or a combination thereof.

8. The method of claim 1, wherein the capping layer comprises titanium nitride.

9. The method of claim 1, wherein the selectively depositing the first metal layer comprises performing a chemical vapor deposition (CVD) or atomic layer deposition (ALD) using a metal complex comprising M (tAlkyl$_2$DAD)$_2$, M(tBuNNCHCtBuO)$_2$, M(eBuNNCHCiPrO)$_2$, and M(tBuNNCMeCMeO)$_2$, wherein M is selected from the group consisting of nickel (Ni), cobalt (Co), platinum (Pt), tungsten (W), ruthenium (Ru), and a combination thereof.

10. A method, comprising:
    selectively depositing a p-type epitaxial layer over an n-type source/drain feature;
    selectively depositing an n-type epitaxial layer over a p-type source/drain feature;
    depositing a dielectric layer over the p-type epitaxial layer and the n-type epitaxial layer;
    forming a first opening through the dielectric layer to expose the p-type epitaxial layer;
    forming a second opening through the dielectric layer to expose the n-type epitaxial layer;
    selectively forming a first metal layer over the n-type epitaxial layer; and
    depositing a second metal over the first metal layer and the p-type epitaxial layer to form a second metal layer;
    depositing a metal nitride capping layer over the second metal layer;
    annealing the first metal layer, the n-type epitaxial layer, the second metal layer, and the p-type epitaxial layer; and
    after the annealing, depositing a metal contact layer over the metal nitride capping layer.

11. The method of claim 10, wherein the p-type epitaxial layer comprises silicon germanium or germanium.

12. The method of claim 10, wherein the n-type epitaxial layer comprises silicon.

13. The method of claim 10, wherein the first metal layer comprises a work function equal to or greater than about 4.5 eV.

14. The method of claim 10, wherein the second metal layer comprises a work function smaller than about 4.5 eV.

15. The method of claim 10, wherein the first metal layer comprises nickel (Ni), cobalt (Co), platinum (Pt), tungsten (W), or ruthenium (Ru).

16. The method of claim 10, wherein the second metal layer comprises titanium (Ti), erbium (Er), yttrium (Y), ytterbium (Yb), europium (Eu), terbium (Tb), lutetium (Lu), thorium (Th), scandium (Sc), hafnium (Hf) zirconium (Zr), tantalum (Ta), or a combination thereof.

17. A method, comprising:
    selectively forming a germanium-containing layer over an n-type source/drain feature;
    selectively forming a silicon layer over a p-type source/drain feature;
    selectively depositing a high work function metal layer over the silicon layer;
    depositing a low work function metal layer over high work function layer and the germanium-containing layer;
    depositing a metal nitride capping layer over the low work function metal layer;
    after the depositing of the metal nitride capping layer, annealing the germanium-containing layer, the silicon layer, the high work function metal layer, and the low work function metal layer to form a high work function metal silicide polycrystallite layer out of the high work function metal layer and the silicon layer and a low work function metal silicide polycrystallite layer out of the low work function metal layer and the germanium-containing layer; and
    after the annealing, depositing a contact metal layer over the metal nitride capping layer.

18. The method of claim 17, wherein the selectively depositing of the high work function metal layer comprises use of a metal complex that has a greater affinity to the silicon layer than to the germanium-containing layer.

19. The method of claim 17, wherein the high work function metal layer comprises a work function equal to or above about 4.5 eV and the low work function metal layer comprises a work function below about 4.5 eV.

20. The method of claim 17, wherein the high work function metal layer comprises titanium (Ti), erbium (Er), yttrium (Y), ytterbium (Yb), europium (Eu), terbium (Tb), lutetium (Lu), thorium (Th), scandium (Sc), hafnium (Hf) zirconium (Zr), tantalum (Ta), or a combination thereof.

* * * * *